United States Patent
Nakagawa et al.

[11] Patent Number: 5,838,174
[45] Date of Patent: Nov. 17, 1998

[54] PHOTOCOUPLER HAVING ELEMENT ISOLATION LAYERS FOR LOW CROSS-TALK LOW STRESS AND HIGH BREAK DOWN VOLTAGE

[75] Inventors: Tsuyoshi Nakagawa, Nagoya; Yoshiaki Nakatsugawa, Anjo; Hajime Inuzuka, Nishio, all of Japan

[73] Assignee: Denso Corporation, Kariya, Japan

[21] Appl. No.: 760,179

[22] Filed: Nov. 25, 1996

[30] Foreign Application Priority Data

Nov. 24, 1995 [JP] Japan .................................. 7-305975
Nov. 15, 1996 [JP] Japan .................................. 8-304975

[51] Int. Cl.⁶ .................................................. H01L 27/15
[52] U.S. Cl. ................................ 257/83; 257/84; 257/85; 257/93; 257/98
[58] Field of Search ................................ 257/80, 81, 82, 257/83, 93, 98, 99, 84, 85

[56] References Cited

U.S. PATENT DOCUMENTS 3,914,137 10/1975 Huffman et al. ............................ 257/80
5,629,534 5/1997 Inuzuka et al. ............................ 257/84

FOREIGN PATENT DOCUMENTS

61-003424 1/1986 Japan .
62-024641 2/1987 Japan .
3-142854 6/1991 Japan .
5-267438 10/1993 Japan .
6-045429 2/1994 Japan .
7-312443 11/1995 Japan ..................................... 257/80
8-125224 5/1996 Japan ..................................... 257/83
8-125225 5/1996 Japan ..................................... 257/83

*Primary Examiner*—Minh-Loan Tran
*Attorney, Agent, or Firm*—Pillsbury Madison and Sutro LLP

[57] ABSTRACT

To prevent leakage of light from a waveguide path to an isolation film in a photocoupler, isolation films are formed so that end portions thereof face a substrate, and a photodiode and phototransistor are formed on islands surrounded by these isolation films. Accordingly, a waveguide path optically coupling the photodiode and photocoupler is formed on a silicon oxide film and on the end portions of the isolation films. The isolation films are formed by alternatingly laminating silicon oxide films having a refractive index smaller than the waveguide path and silicon nitride films having a refractive index equal to or greater than the waveguide path. Accordingly, the several film thicknesses of the silicon nitride films are established to be smaller than the wavelength of light within the silicon nitride films. Because of this, leakage of light from the waveguide path to the silicon nitride films of the isolation films can be prevented.

14 Claims, 11 Drawing Sheets

PHOTOCOUPLER HAVING ELEMENT ISOLATION LAYERS FOR LOW CROSSTALK LOW STRESS AND HIGH BREAK DOWN VOLTAGE

CROSS-REFERENCE TO RELATED APPLICATION

The present application is related to and claims priority from Japanese Patent Application Nos. Hei 7-305975 and Hei 08-304975, incorporated herein by reference.

BACKGROUND OF THE INVENTION

1. Field of the Invention

This invention relates to a semiconductor device having an isolated island on a substrate, for example, a semiconductor for use in a single-chip type photocoupler provided with a light-emitting element and a light-receiving element on a single chip.

2. Description of Related Art

In recent years, electrical isolation using a photocoupler has frequently been performed as an isolating technique for an input/output interface portion and power-supply portion of a variety of electronic equipment. This photocoupler is a hybrid type incorporating a light-emitting element chip using a compound semiconductor of GaAs or the like and a light-receiving chip using silicon in a single package. Additionally, a semiconductor device wherein this photocoupler is integrated monolithically on a single chip is known (for example, such devices are disclosed in Japanese Patent Application Laid-Open No. Sho 48-46278 and U.S. Pat. No. 3,914,137).

Furthermore, Japanese Patent Application No. Hei 6-274475 discloses a multichannel type photocoupler for preventing mutual crosstalk between channels as a conductive-material isolated structure of a light-emitting element-side circuit and a light-receiving element-side circuit in a monolithic photocoupler.

Figure 15:
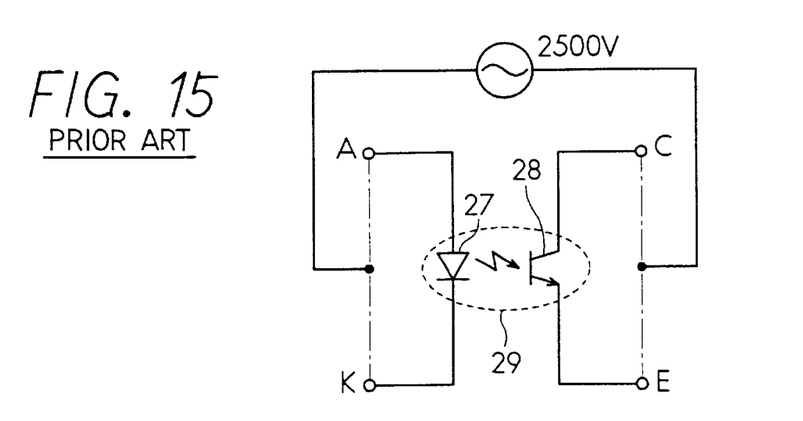
FIG. 15 is an equivalent circuit of a photocoupler according to the prior art.
Figure 16:
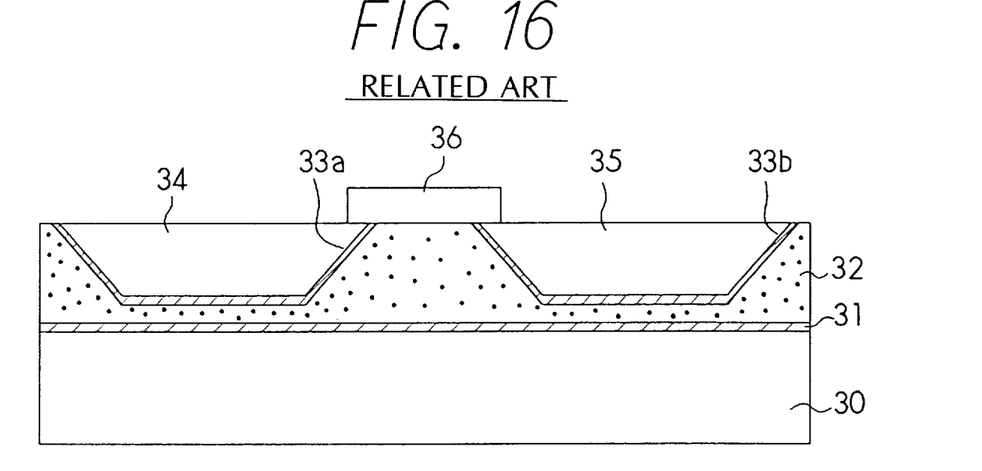
FIGS. 16–21 are cross-sectional views of a monolithic photocoupler according to the prior art.

A schematic thereof (described in connection with one of the channels) is shown in FIGS. 15 and 16. As shown in FIG. 15, a photocoupler 29 is made up of a light-emitting diode 27 and a phototransistor 28. As shown in FIG. 16, polycrystalline silicon 32 is disposed on a substrate 30 via a silicon oxide film 31, a first island 34 surrounded by a silicon oxide film 33a and a second island 35 surrounded by a silicon oxide film 33b are formed on the polycrystalline silicon 32, the light-emitting diode 27 of FIG. 15 is formed on the first island 34, the phototransistor 28 of FIG. 15 is formed on the second island 35, and these elements are optically coupled by a waveguide-path forming member 36.

Figure 17:
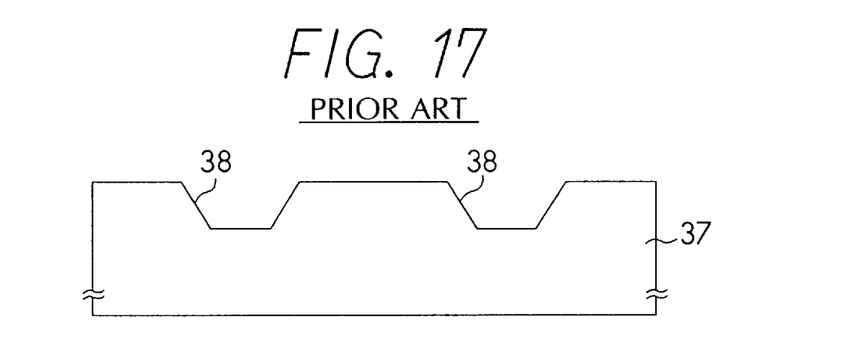
Figure 18:
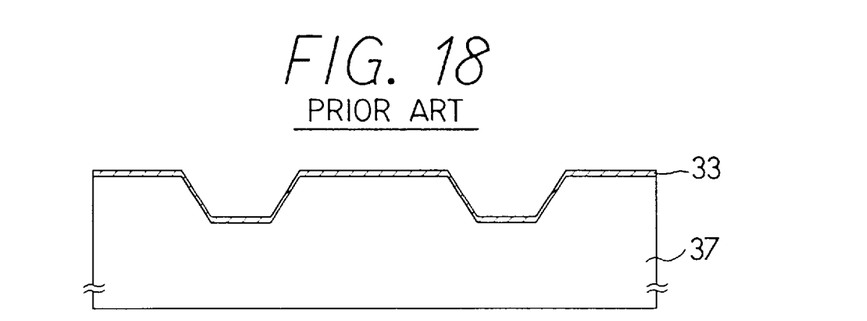
Figure 19:
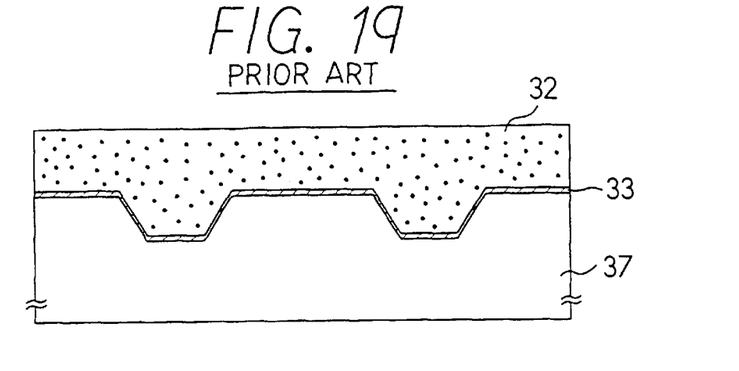
Figure 20:
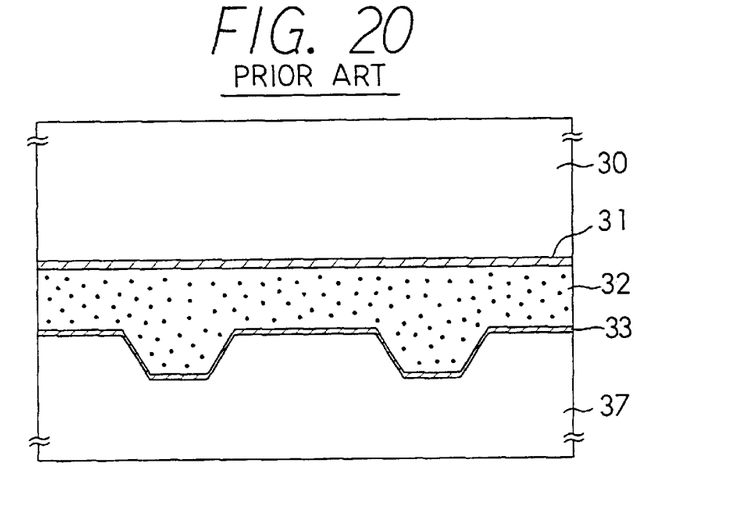
Figure 21:
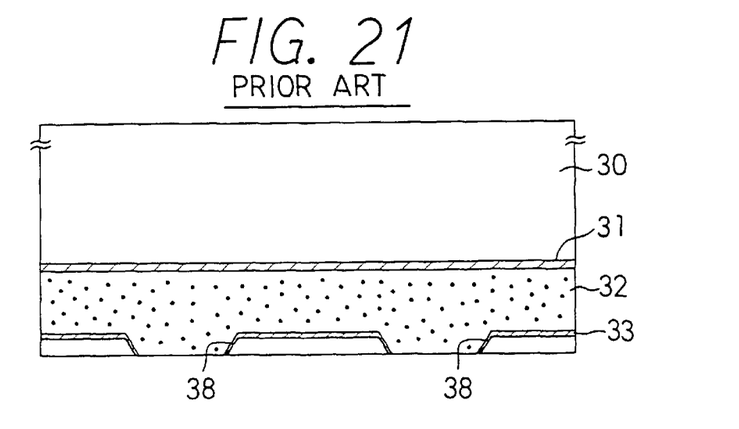

In fabrication, as shown in FIG. 17, a trench 38 having a depth of 20 to 40 $\mu$m is formed in a predetermined area of a silicon substrate 37 by a wet or dry-etching process; as shown in FIG. 18, the silicon oxide film 33 is formed on an entirety thereof to a thickness of 1 to 2 $\mu$m by thermal oxidation; as shown in FIG. 19, the polycrystalline silicon 32 is formed to a thickness of 80 to 100 $\mu$m by a chemical vapor deposition process; after the surface has been polished, as shown in FIG. 20, bonding with the mirror surface of the silicon substrate 30 via the silicon oxide film 31 is performed; and as shown in FIG. 21, the silicon substrate 37 is ground to a mirror surface from the back surface of the silicon substrate 37 until an end (bottom surface) of the trench 38 appears. Thereafter, although not illustrated, elements are formed in the several islands of the ground surface which has become a mirror surface, and thereafter the surface is thermally oxidized and an oxide film is formed on the ground surface. At this time, a thermal oxide film is not formed on the surface of the silicon oxide film. Finally, the several elements are optically coupled by the waveguide-path forming member 36 and the monolithic, photocoupler is fabricated.

An insulation breakdown voltage of 2500 V or more between the primary-side circuit (light-emitting element chip) and secondary-side circuit (light-receiving element chip) is necessary in a hybrid type photocoupler, and equivalent insulation breakdown voltage is required for a monolithic photocoupler as well.

However, because a silicon oxide film and polycrystalline silicon film are used as isolating films in the above-described isolating structure, the insulation breakdown voltages of the thermal silicon oxide film and the polycrystalline silicon film are respectively 300 to 500 V/$\mu$m and 5 to 10 V/$\mu$m, and in a case of isolation by a silicon oxide film of 1.0 $\mu$m thickness, insulation breakdown voltage of 1,000 V or more cannot be expected. Additionally, when the film thickness of the silicon oxide film is increased to raise the insulation breakdown voltage, there is a possibility that the substrate may be warped during formation of the silicon oxide film 33 indicated in FIG. 18 due to a difference in thermal expansion coefficients of the silicon oxide film 33 and silicon substrate 37, and the yield of the device being fabricated may be reduced. To solve this, the photocoupler may be made up of isolating layers which are a plurality of dielectric isolating layers of differing thermal expansion coefficients to achieve prevention of warping due to a thermal expansion differential at a high breakdown voltage in a monolithic semiconductor device.

However, in a semiconductor device wherein a surface insulation film (for example, a thermal oxide film) on an isolation film on a substrate such as the foregoing is not formed, when a material having a refractive index equal to or greater than the waveguide path is selected as the isolation film making up this isolating layer, light emitted by the light-emitting element leaks from the waveguide path and efficiency of propagation of light to the light-receiving element declines.

SUMMARY OF THE INVENTION

With the above problems of the prior art in mind, it is an object of the present invention to provide a semiconductor device which prevents leakage of light from a waveguide path to an isolation film.

It is a further object of this invention to provide a semiconductor device which prevents leakage of light from a waveguide path to an isolation film in a semiconductor device wherein a light-receiving element and a light-emitting element are formed in a region isolated by the isolation film composed of a material having a refractive index equal to or greater than a waveguide path, and the waveguide path which propagates light from the light-emitting element to the light-receiving element is formed on the isolation film.

It is a yet further object of the present invention to provide a semiconductor device which alleviates internal stress in an isolation film, together with preventing leakage of light from a waveguide path to the isolation film.

The above objects are achieved according to a first aspect of the present invention by providing a device which has a plurality of isolation films with an end portion thereof facing a surface of a substrate which are formed within the substrate; a plurality of islands made up of a region surrounded by these isolation films which are structured on the substrate; and a light-emitting element and a light-receiving element which are formed in differing islands among these islands. Accordingly, a surface insulation film is formed on a substrate of other than the isolation-film end portion; and a waveguide path optically coupling the light-emitting element and the light-receiving element is formed on the surface insulation film and on an end portion of the isolation film.

In this structure, when light is emitted by the light-emitting element, the light propagates along the waveguide path and reaches the light-receiving element. Here, first insulation films making up a plurality of isolation films have a refractive index which is smaller than a refractive index of the material making up the waveguide path, and so reflect entirely. Additionally, second insulation films have a refractive index identical to or greater than a refractive index of the material making up the waveguide path, but substantially no light penetrates from the waveguide path to the isolation film due to film thickness being established to be smaller than a wavelength of light in the waveguide path. Because of this, leakage of light from the waveguide path to the isolation film can be prevented. This is based on a principle identical with that wherein, in a diffraction lattice composed of a slit, substantially no light passes through the slit when the slit width is smaller than the light wavelength.

Preferably, the surface insulation film is made up of a surface oxide film formed by thermal oxidation of the silicon substrate, and so formation thereof is facilitated. In this case, the end portion of the isolation film is not thermally oxidized, and so the surface oxide film is not formed thereat. However, because of the features described above, leakage of light from the waveguide path to the isolation film can be prevented. Also, the width of the second insulation films can accurately be controlled, and leakage of light from the waveguide path to the isolation film can reliably be prevented.

According to this aspect of the present invention, internal stress in the entirety of the isolation films can be alleviated. Because of this, the several elements in a monolithic type photocoupler wherein the light-emitting element and the light-receiving element are optically coupled can have a high breakdown voltage, and moreover deflection of the substrate can be prevented. Because of this, internal stress in the isolation film is alleviated, and along with this, leakage of light from the waveguide path to the isolation film can be prevented.

In particular, silicon oxide film may be employed as the first film, and along with this, silicon nitride film may be employed as the second film, and so the device can easily be fabricated using ordinary IC fabrication techniques, and along with this, a device having superior breakdown voltage is achieved because a silicon nitride film has been employed. Also, it is possible that a device for preventing leakage is provided on the end portion of the isolation film. Because of this, leakage of light from the waveguide path to the isolation film can be prevented.

A leakage-prevention film composed of a material having a refractive index smaller than a refractive index of the waveguide path may be disposed between the end portion of the isolation film and the waveguide path as the leakage-preventing device, and so light from the waveguide path is entirely reflected by the leakage-prevention film. Because of this, leakage of light from the waveguide path to the isolation film can be prevented.

Internal stress in the entirety of the isolation films can be alleviated. Because of this, the several elements in a monolithic type photocoupler wherein the light-emitting element and the light-receiving element are optically coupled can have a high breakdown voltage, and moreover deflection of the substrate can be prevented. Because of this, internal stress in the isolation film is alleviated, and along with this, leakage of light from the waveguide path to the isolation film can be prevented.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

A first embodiment of the present invention will be described hereinafter with reference to the drawings.

Figure 1A:
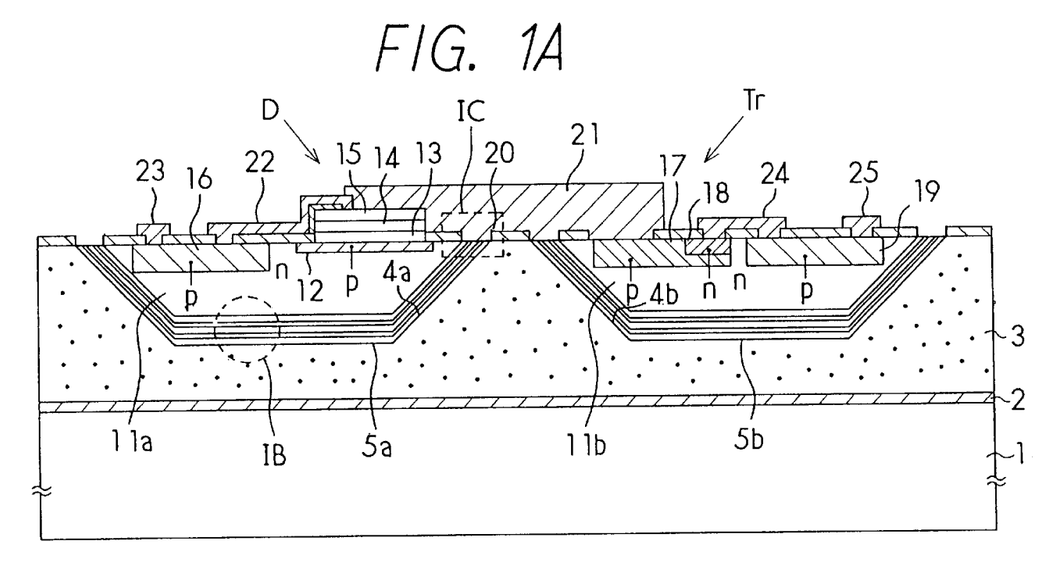
FIG. 1A is a cross-sectional view of a monolithic photocoupler according to a first embodiment of the present invention.

In FIG. 1A, a silicon oxide film 2 is formed on an upper surface of a silicon substrate 1, and a polycrystalline silicon layer 3 is formed thereabove. According to the first embodiment, the substrate is made up of the silicon substrate 1 and the polycrystalline silicon layer 3. Accordingly, concavities 4a and 4b are formed on the upper-surface side of the polycrystalline silicon layer 3.

Isolation films 5a and 5b are formed on the surface of these concavities 4a and 4b. According to this embodiment, a device wherein a silicon oxide film 6, a silicon nitride film 7, a silicon oxide film 8, a silicon nitride film 9, and a silicon oxide film 10 are laminated is used as the isolation films 5a and 5b, shown in FIG. 1B. The film thickness of the silicon oxide film 6 is 2 $\mu$m, the film thickness of the silicon nitride film 7 is 0.4 $\mu$m, the film thickness of the silicon oxide film 8 is 2 $\mu$m, the film thickness of the silicon nitride film 9 is 0.4 $\mu$m, and the film thickness of the silicon oxide film 10 is 2 $\mu$m; and the silicon oxide films 6, 8, and 10 as first films and the silicon nitride films 7 and 9 as second films are formed by a low-pressured chemical vapor deposition method. That is, the silicon oxide films 6, 8, and 10 are LTO (low-temperature oxide) films.

According to the first embodiment, the silicon oxide film 6, the. silicon oxide film 8, and the silicon oxide film 10 make up a first insulation film, and the silicon nitride film 7 and silicon nitride film 9 make up a second insulation film. When silicon oxide as the first material and silicon nitride as the second material are compared, the refractive index is greater for the silicon nitride than for the silicon oxide, and internal stress subsequent to film formation indicates compression stress for the silicon oxide and tensile stress for the silicon nitride. This difference in internal stress is due to a difference in the thermal expansion coefficients of the two materials.

An n-type monocrystalline silicon island 11a is formed within the concavity 4a, and along with this, an n-type monocrystalline silicon island 11b is formed within the concavity 4b. The n-type impurity concentration of these monocrystalline silicon islands 11a and 11b is approximately $10^{16}$ cm$^{-3}$. Additionally, the monocrystalline silicon island 11b becomes the collector region of a phototransistor Tr which is the light-receiving element of the photocoupler.

A p-type diffusion region 12 is formed on a surface portion of the monocrystalline silicon island 11a. An n-type $Al_xGa_{1-x}As$ layer 13, an n-type GaAs layer 14, and a p-type GaAs layer 15 are laminated on the p-type diffusion region 12.

The n-type $Al_xGa_{1-x}As$ layer 13 is composed of a GaAs mixed crystal, and is formed on the surface of the monocrystalline silicon island 11a through heteroepitaxial growth by a metal organic chemical vapor deposition process. Furthermore, the p-type GaAs layer 15 is formed on the n-type GaAs layer 14 through heteroepitaxial growth by a metal organic chemical vapor deposition process.

In this way, a light-emitting diode D is formed in the monocrystalline silicon island 11a surrounded by the isolation film 5a as a light-emitting element composed of a laminate of the n-type $Al_xGa_{1-x}As$ layer 13, the n-type GaAs layer 14, and the p-type GaAs layer 15.

Additionally, a p-type diffusion region 16 is formed on a surface portion of the monocrystalline silicon island 11a, and a light-emitting-side processing circuit is formed in the p-type diffusion region 16.

Meanwhile, a p-type base region 17 is formed in a predetermined region on a surface portion of the monocrystalline silicon island 11b, and along with this, an n-type emitter region 18 is formed in on a surface portion an interior thereof. Accordingly, the phototransistor Tr of n/p/n structure is formed as the light-receiving element by the n-type emitter region 18, the p-type base region 17, and the monocrystalline silicon island 11b.

In this way, the phototransistor Tr is formed in the monocrystalline silicon island 11b surrounded by the isolation film 5b.

Additionally, a p-type diffusion region 19 is formed in the monocrystalline silicon island 11b, and a light-receiving-side processing circuit is formed in the p-type diffusion region 19.

A silicon oxide film 20 is formed on the surface of the polycrystalline silicon layer 3 including the surfaces of the monocrystalline silicon islands 11a and 11b, and the silicon oxide film 20 has a film thickness of 1 μm by a thermal oxidation method. Herein, a thermal oxidation film is not formed on the end portions (i.e., portions facing the same plane as the polycrystalline silicon layer 3 and the monocrystalline silicon islands 11a and 11b) of the isolation films 5a and 5b, and so the silicon oxide film 20 is formed on the polycrystalline silicon layer 3, the monocrystalline silicon island 11a, and the monocrystalline silicon island 11b, as shown in FIG. 1C.

A waveguide path composed of a silicon nitride layer is formed on the silicon oxide film 20 between the light-emitting diode D and the phototransistor Tr, on the polycrystalline silicon layer 3, and on the isolation films 5a and 5b. The waveguide path 21 is formed to a thickness of approximately 2 to 3 μm by an ion-plating process. The phototransistor Tr is optically coupled to the light-emitting diode D by this waveguide path 21. As shown in FIG. 1A, the waveguide path 21 and the isolation films 5a and 5b are in contact.

Additionally, an aluminum lead 22 is formed on the silicon oxide film 20 at the monocrystalline silicon island 11a, and the p-type GaAs layer 15 and the p-type diffusion region 16 are electrically connected by the aluminum lead 22. An aluminum lead 23 is formed on the silicon oxide film 20 at the monocrystalline silicon island 11a, and the aluminum lead 23 is electrically connected to the p-type diffusion region 16, and together with this, the aluminum lead 23 is extended within the monocrystalline silicon island 11a.

An aluminum lead 24 is formed on the silicon oxide film 20 at the monocrystalline silicon island 11b, and the n-type emitter region 18 and the p-type diffusion region 19 are electrically connected by the aluminum lead 24. Further, an aluminum lead 25 is formed on the silicon oxide film 20 at the monocrystalline silicon island 11b, and the aluminum lead 25 is electrically connected to the p-type diffusion region 19, and together with this, the aluminum lead 25 is extended within the monocrystalline silicon island 11b.

Figure 1B:
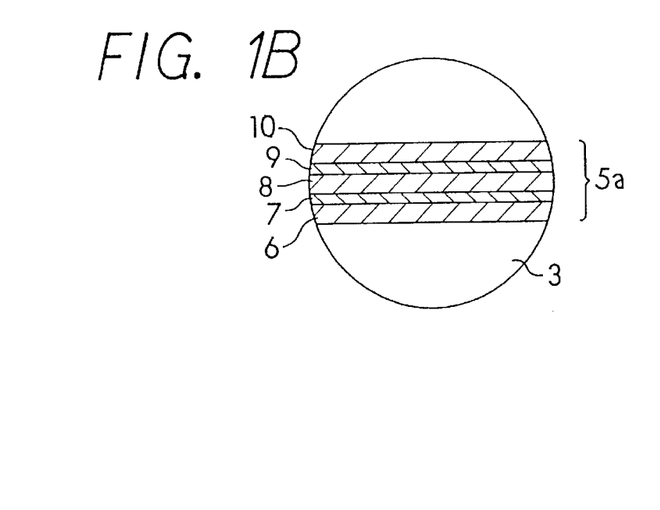
FIG. 1B is an enlarged view of the dotted-line IB portion of FIG. 1A.
Figure 1C:
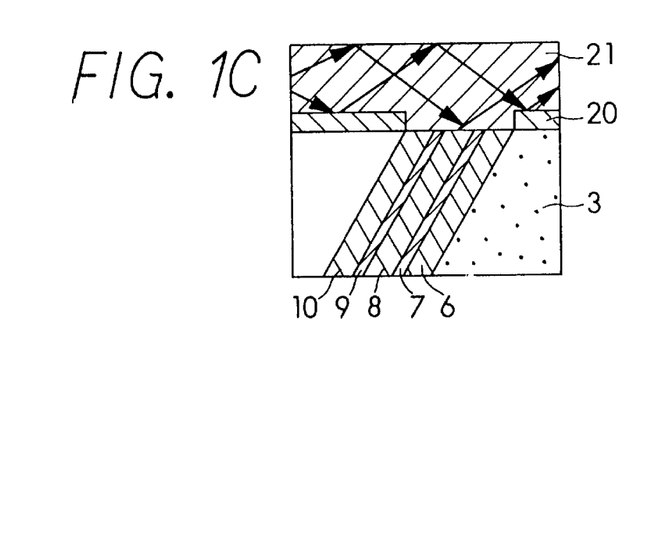
FIG. 1C is an enlarged view of the dotted-line IC portion of FIG. 1A.
Figure 2:
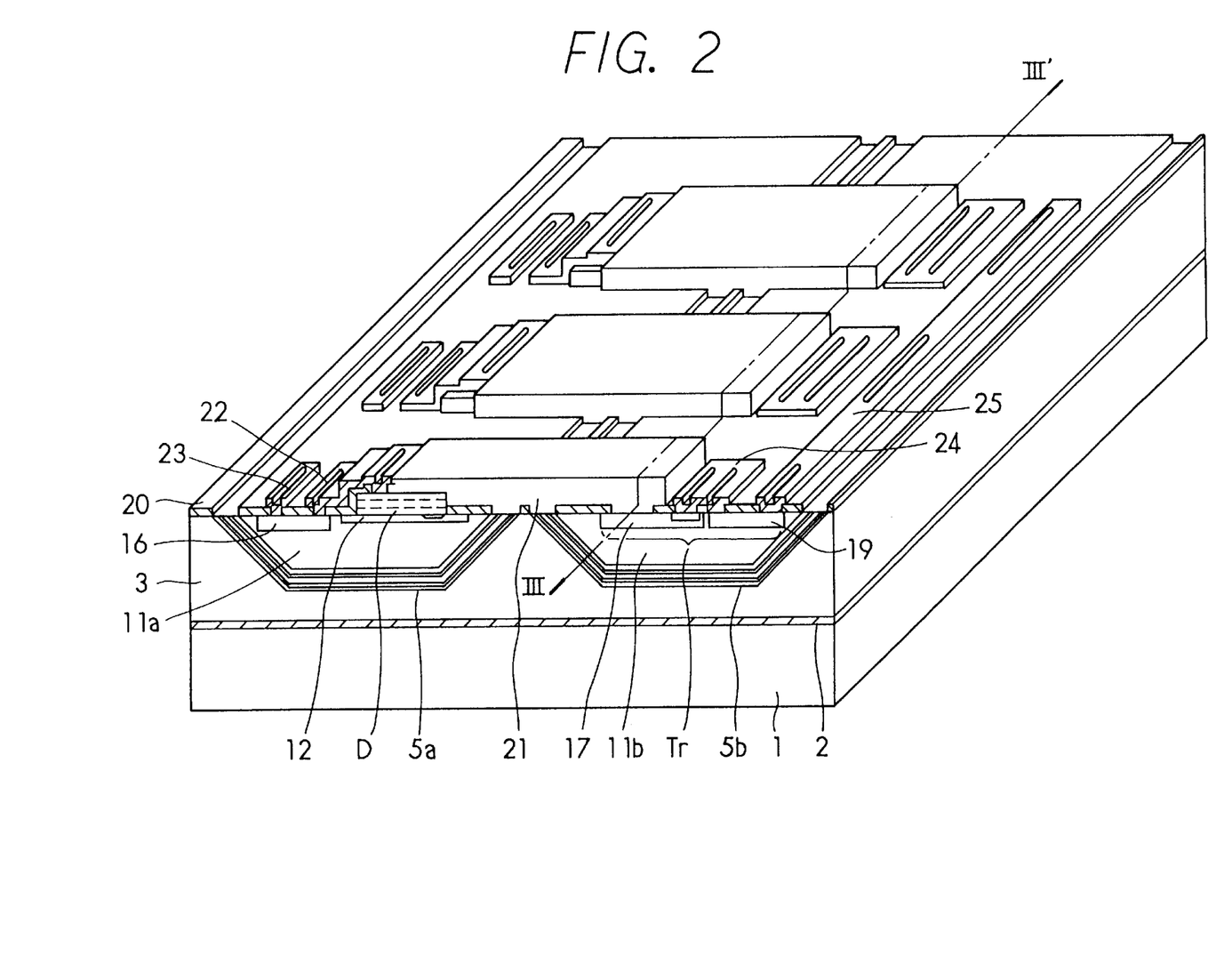
FIG. 2 is a perspective view of the monolithic photocoupler according to the first embodiment.
Figure 3:
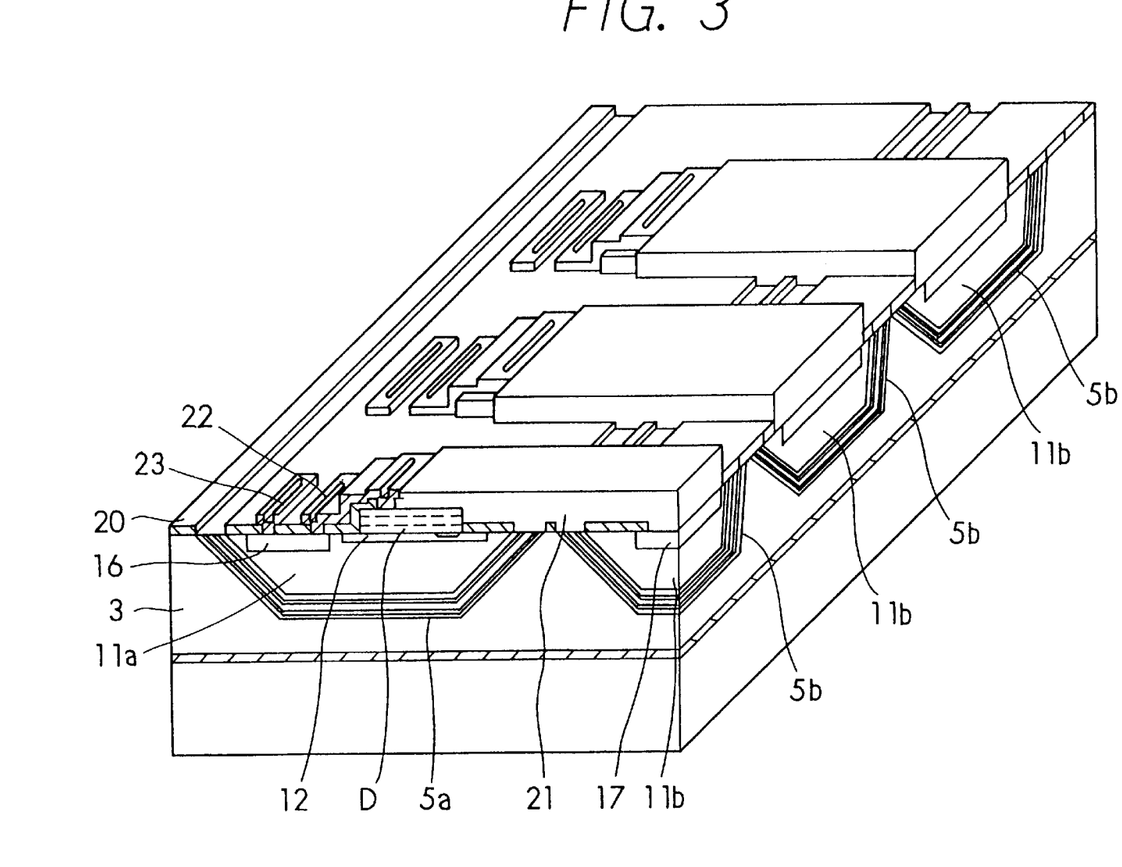
FIG. 3 is a sectional view taken along line III—III' of FIG. 2.

According to the first embodiment, plural channels of the photocoupler shown in FIGS. 1A–1C are formed on a substrate as a multichannel type monolithic photocoupler as shown in FIG. 2. As shown in FIG. 3, several diodes D and several phototransistors Tr among the several channels are respectively and mutually isolated by the above-described isolation films 5a and 5b. Because of this, faulty operation, i.e., crosstalk, due to leakage of light between adjacent channels can be prevented.

A mode of operation of a monolithic photocoupler structured in this way will be described next.

In FIG. 1A, when voltage is applied between the anode and cathode of the light-emitting diode D due to a signal generated in a processor circuit, positive holes and electrons are implanted, recoupling occurs at the junction of the n-type GaAs layer 14 and the p-type GaAs layer 15, and light is emitted. The light emitted by the light-emitting diode D passes through the waveguide path 21 as a waveguide-path forming member and reaches the p-type base region 17 of the phototransistor Tr. When this occurs, optoelectric current generated at the pn junction of the p-type base region 17 and an n-type collector region (the n-type monocrystalline silicon island 11b) of the phototransistor Tr is amplified and extracted as collector and emitter current. The extracted current undergoes signal processing in a processor circuit within the p-type diffusion region 19.

A schematic of a method of fabrication of this monolithic photocoupler will be described next.

Figure 6:
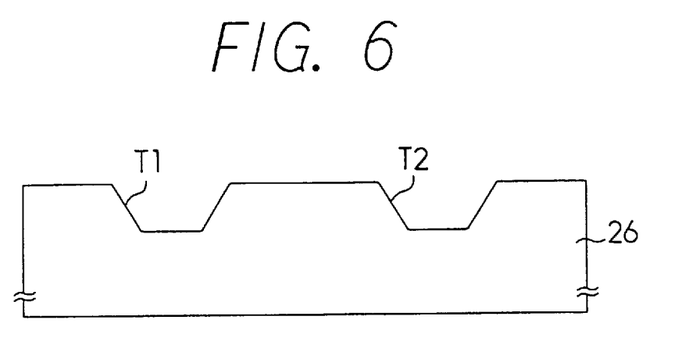
FIGS. 6–13 are cross-sectional views of fabrication of the device in FIG. 1.
Figure 7:
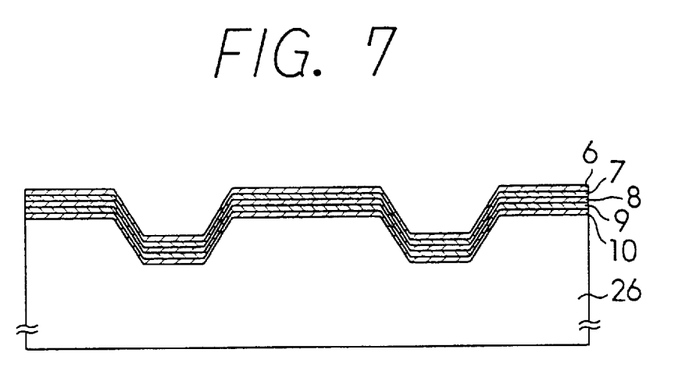

Firstly, as shown in FIG. 6, a silicon substrate 26 is prepared, and trenches T1 and T2 of a depth of 20 to 40 μm are eformed in a predetermined region on a surface of the silicon substrate 26 by a wet or dry-etching process. Thereafter, as shown in FIG. 7, an LTO film 10, a silicon nitride film 9, an LTO film 8, a silicon nitride film 7, and an LTO film 6 are sequentially laminated on the surface of the silicon substrate 26 by a chemical vapor deposition process.

The film-forming conditions for the LTO films 10, 8, and 6 at this time are:

temperature: 425° C.;
time: 92 min.;

gas used: SiH$_4$/He (19.8%) 202 sccm,
O$_2$ MFC1 20 sccm, and
MFC$_2$ 100 sccm; and
pressure: 0.3 Torr.

The insulation breakdown voltage of the LTO films 10, 8, and 6 formed in this way were 550 V/μm (actual measured value).

The film-forming conditions for the silicon nitride films 9 and 7 at this time are:

temperature: 800° C.;

time: 192 min;

gas used: SiH$_4$/He (19.8%) 202 sccm and
NH$_3$ (100%) 600 sccm; and pressure: 0.74 Torr.

The insulation breakdown voltage of the silicon nitride films 9 and 7 formed in this way were 770 V/μm (actual measured value).

Figure 4:
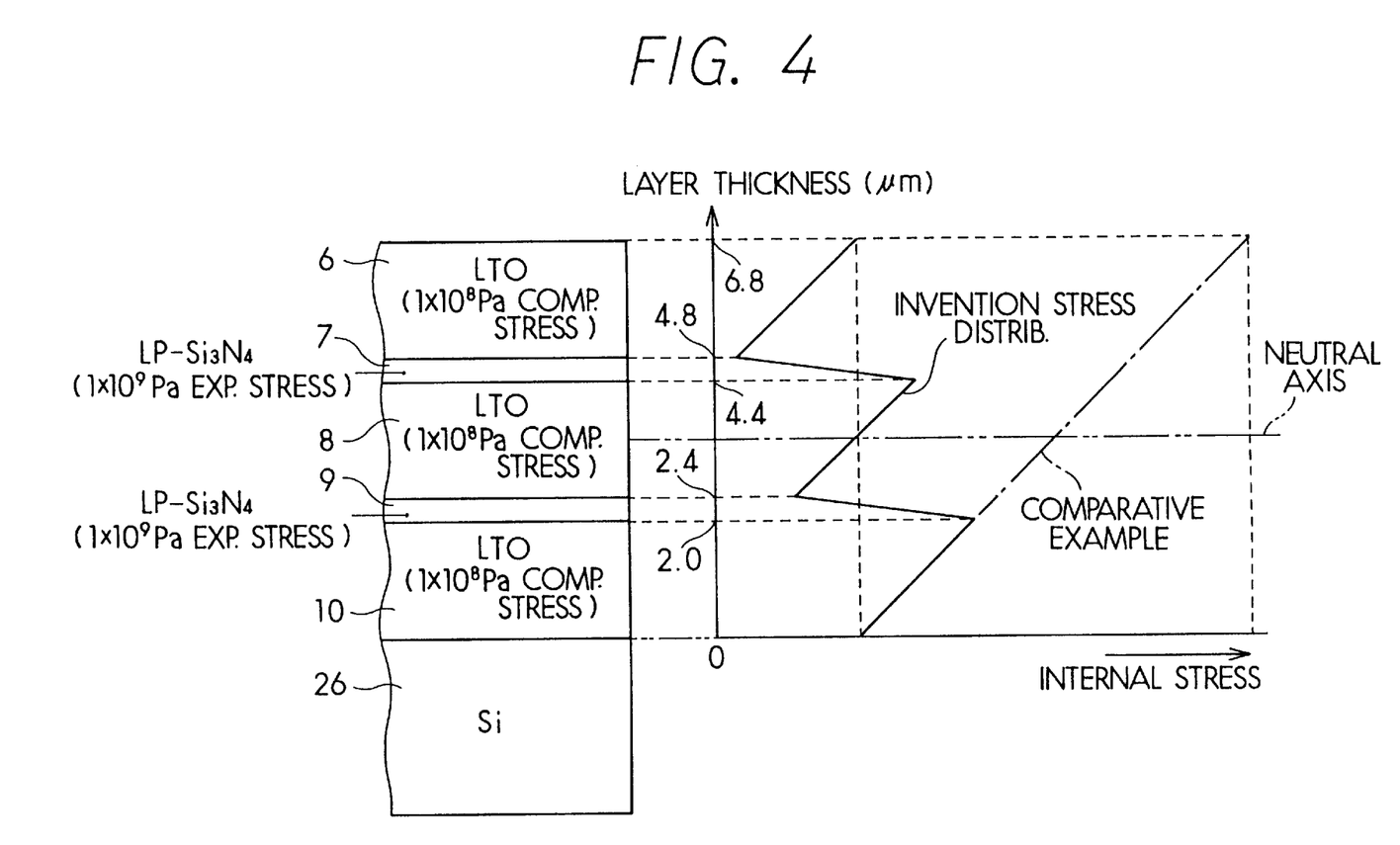
FIGS. 4 and 5 show stresses in the first embodiment.
Figure 5:
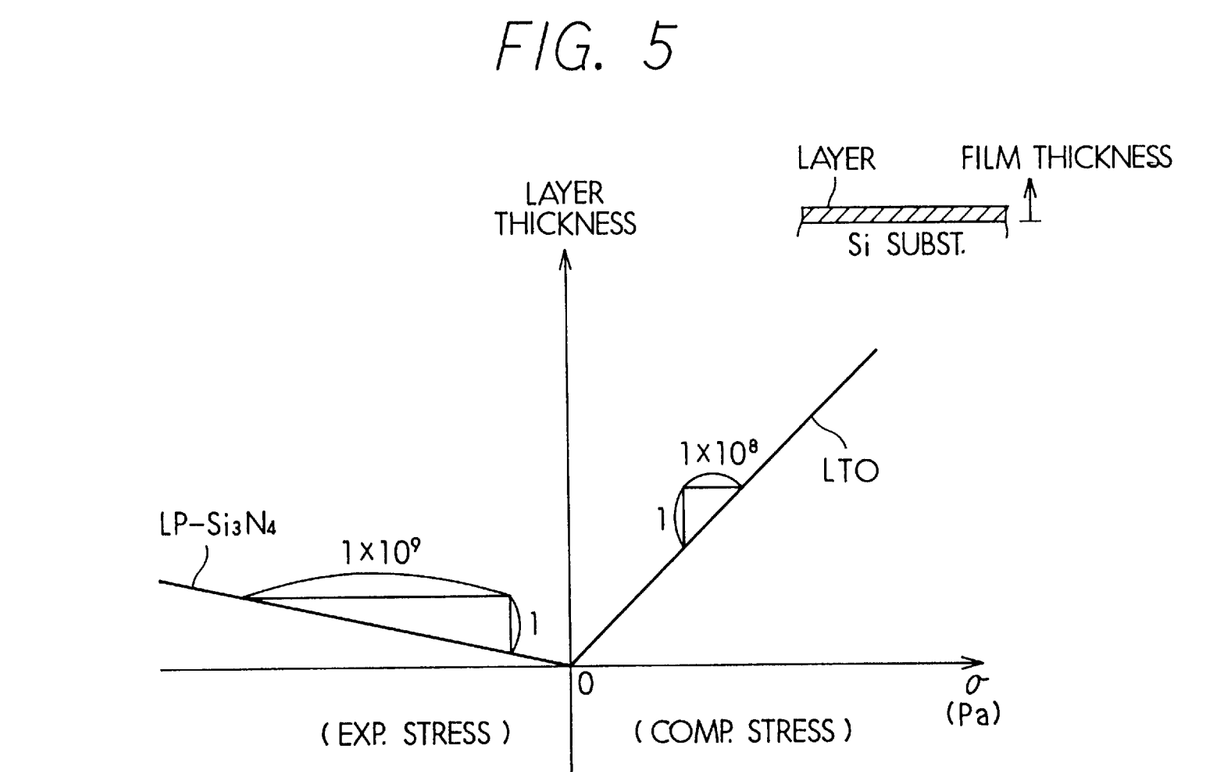

FIG. 5 indicates internal stress in a case wherein an LTO film (low-pressure silicon oxide film) fabricated under these conditions has been formed and in a case wherein a low-pressure silicon nitride film has been formed. In the case where the LTO film has been formed, there exists compression internal stress in the direction of film formation. In the case where the low-pressure silicon nitride film has been formed, there exists tensile internal stress in the direction of film formation. Accordingly, when an insulation film is formed by solely an LTO film, as shown by the dotted line in the internal-stress distribution diagram at normal temperature indicated in FIG. 4, a state having compression internal stress is obtained, and deflection of the substrate may occur. In contrast to this, a multiple-layer film composed of LTO films and silicon nitride films is used according to the present embodiment, and so the stress distribution indicated by solid lines in FIG. 4 is obtained, and due to a canceling-out effect of internal stresses, deflection is less susceptible to occur in comparison with the case wherein the insulation film has been formed by solely an LTO film.

Additionally, the present embodiment provides three layers of LTO films having a film thickness of 2.0 μm and two layers of silicon nitride films having a film thickness of 0.4 μm. Therefore, breakdown voltage is 550 (V/μm)×2 (μm)× 3+770 (V/μm)×0.4 (μm)×2=3,916 V, and because the two islands are isolated by two layers, there exists a breakdown voltage of 7,832 V. Accordingly, breakdown voltage of 6,000 V or more is attained.

Figure 8:
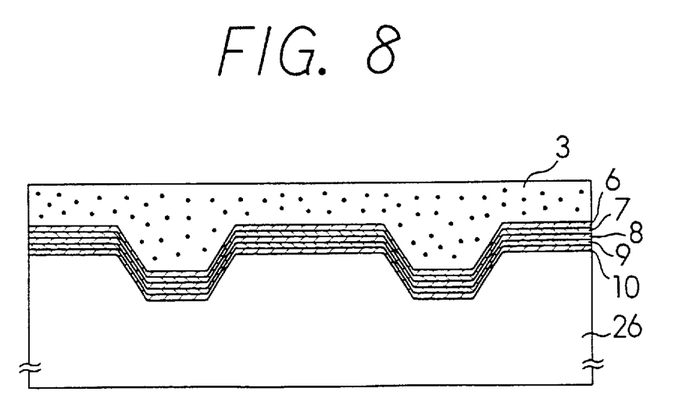

To return to the description of the method of fabrication, in continuation, as shown in FIG. 8, the polycrystalline silicon layer 3 of a thickness of 80 to 100 μm is formed on the LTO film 6 by a chemical vapor deposition process (film-forming temperature: 600° C.). At this time, flattening occurs with no deflection of the substrate, and so film formation can easily be performed, and yield for the fabricated device is high. Furthermore, the surface of the polycrystalline silicon layer 3 is polished to a suitable thickness to obtain a mirror surface.

Figure 9:
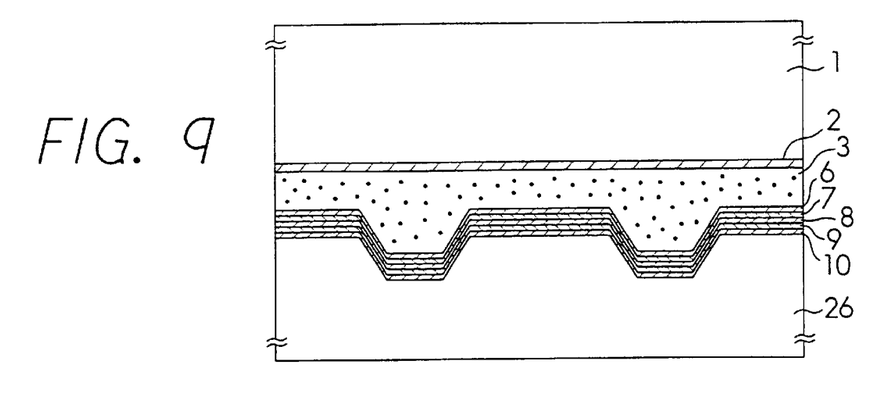

Accordingly, as shown in FIG. 9, a silicon oxide film 2 of a thickness of 0.1 μm is formed on the surface of the polycrystalline silicon layer 3 by thermal oxidation. Additionally, a silicon substrate 1 having a surface which has been ground to a mirror finish is prepared, the mirror surface of this silicon substrate 1 and the silicon oxide film 2 are bonded, and heat treatment is performed to strengthen the junction.

Further, the junction is strengthened by bonding the silicon substrate 1 and the polycrystalline silicon layer 3 via the silicon oxide film 2, but it is also acceptable to directly bond the silicon substrate 1 and the polycrystalline silicon layer 3 without using the silicon oxide film 2.

Figure 10:
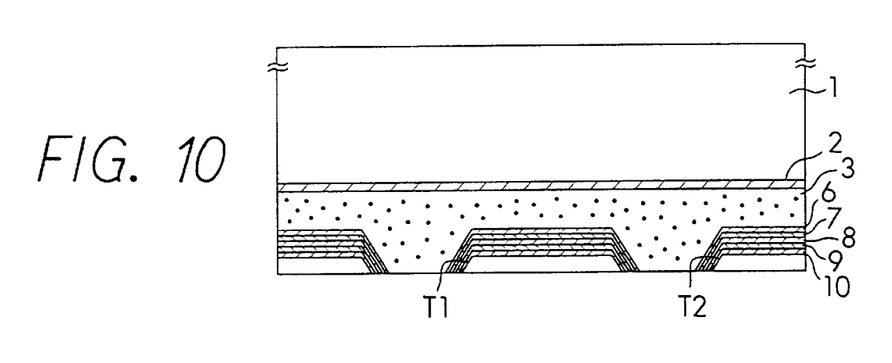

Next, as shown in FIG. 10, the silicon substrate 26 is ground from the back surface thereof to a mirror surface until ends (bottom surfaces) of the trenches T1 and T2 appear. As a result of this, the several isolated islands are demarcated and formed.

Figure 11:
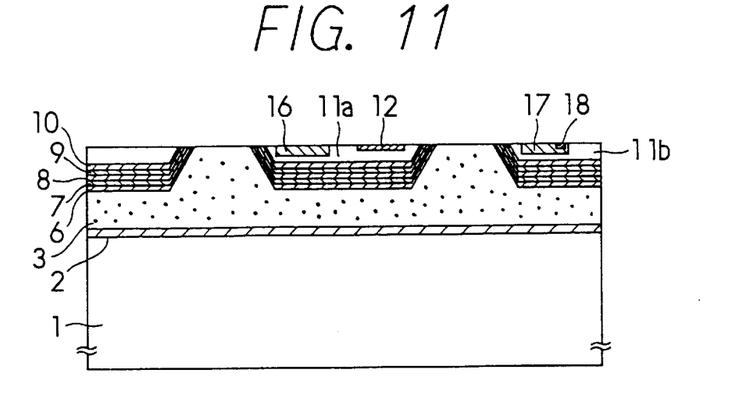

Further, as shown in FIG. 11, impurities are diffused within the monocrystalline silicon islands 11a and 11b, forming the p-type diffusion regions 12 and 16, the p-type base region 17, and the n-type emitter region 18.

Figure 12:
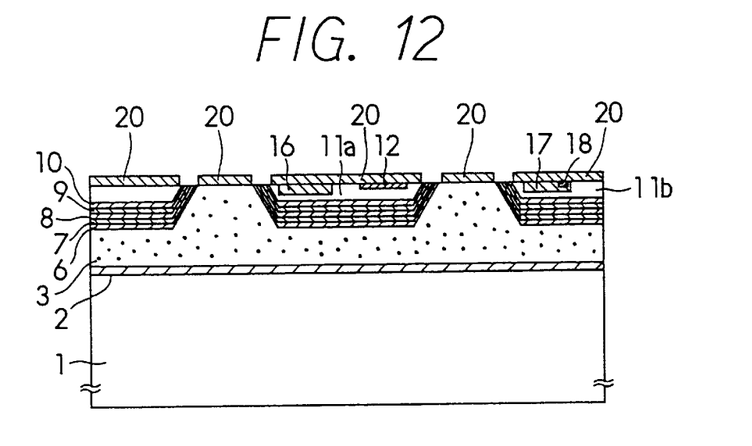

Thereafter, as shown in FIG. 12, a silicon oxide film 20 which is a thermal oxide film is formed on the ground mirror surface by thermal oxidation. At this time, a thermal oxidation film is not formed on the end portions (i.e., portions facing the same plane as the polycrystalline silicon layer 3 and the monocrystalline silicon islands 11a and 11b) of the isolation films 5a and 5b as was described above, and so the silicon oxide film 20 is formed on the polycrystalline silicon layer 3, the monocrystalline silicon island 11a, and the monocrystalline silicon island 11b.

Figure 13:
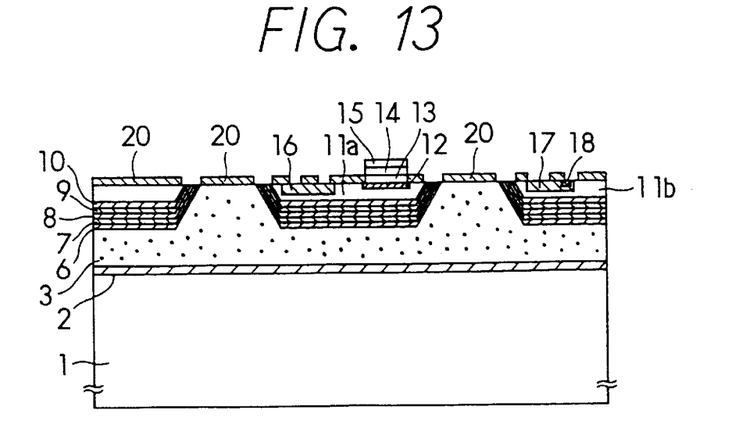

Accordingly, as shown in FIG. 13, a via hole is formed in a predetermined portion of the silicon oxide 20, and along with this, the light-emitting diode D and the phototransistor Tr are formed.

Thereafter, as shown in FIG. 1A, elements are formed in the several islands, and along with this, the waveguide path 21 composed of a silicon nitride film is disposed. In this way, the monolithic photocoupler is fabricated.

In this way, according to the present embodiment, the insulation film used in isolating the several islands is structured by alternatingly laminating the silicon oxide films 6, 8, and 10 having a refractive index smaller than the refractive index of the silicon nitride films making up the waveguide path 21 and the silicon nitride films 7 and 9 having a refractive index equal to the refractive index of the silicon nitride films making up the waveguide path 21.

As shown in FIG. 1C, incidence at the interface of the waveguide path 21 and the end surfaces of the isolation films 5a and 5b of the above-described structure is from a region having a large refractive index to a region having a low refractive index, and so light is completely reflected and is not incident. Additionally, incidence from the waveguide path 21 to the silicon nitride films 7 and 9 is to a region having an identical refractive index, and so light is not completely reflected. However, by establishing the several film thicknesses of the silicon nitride films 7 and 9 to be smaller than the wavelength (Indicated by λ/n when wavelength of light in the atmosphere is taken to be λ and the refractive index within the silicon nitride films 7 and 9 is taken to be n. In a case of the present embodiment, λ=960 nm, n=2.0, λ/n=480 nm=0.48 μm) of light within the silicon nitride films 7 and 9, there comes to be substantially no penetration of light from the waveguide path 21 to the silicon nitride films 7 and 9.

According to the foregoing, leakage of light from the waveguide path 21 to the isolation films can be prevented. This is based on a principle identical with that wherein, in a diffraction lattice composed of a slit, substantially no light passes through the slit when slit width is smaller than light wavelength. In the present embodiment, a leakage preventing device is structured so that film thickness is established to be smaller than the wavelength of light within the silicon nitride films 7 and 9 on at least the end portions.

Additionally, because the structure is such that the silicon oxide films 6, 8, and 10, and the silicon nitride films 7 and 9 are alternatingly laminated, width of the silicon nitride films 7 and 9 can accurately be controlled, and leakage of light from the waveguide path to the isolation films can reliably be prevented.

Furthermore, the present embodiment was structured by alternatingly laminating the LTO films 6, 8, and 10 (first insulation films) having compression internal stress and the low-pressured silicon nitride films 7 and 9 (second insulation films) having tensile internal stress as the insulation films used in isolating the several islands, and so deflection is suppressed by a canceling-out effect due to the tensile internal stress and the compression internal stress, and film thickness can be thick and breakdown voltage can be high due to this suppression of deflection. As a result of this, high breakdown voltage and prevention of deflection can be obtained. Because of this, internal stress within the isolation films is alleviated, and along with this, leakage of light from the waveguide path to the isolation films can be prevented.

Because silicon oxide films are employed as the first insulation films and silicon nitride films are employed as the second insulation films, the device can easily be fabricated using ordinary IC fabrication art, and along with this, a device having superior breakdown voltage is achieved because a silicon nitride film has been employed.

Further, it is preferred that the total film-thickness ratio of the LTO films and the silicon nitride films is 6 to 16:1. According to the present embodiment, the total film thickness of the LTO films 6, 8, and 10 is 6 $\mu$m and the total film thickness of the silicon nitride films 7 and 9 is 0.8 $\mu$m, and the total film-thickness ratio of the LTO films and the silicon nitride films is 7.5:1. Film thickness of the several films is established after calculating the total film thickness required for breakdown voltage, to be smaller than the wavelength of light (for example 0.48 $\mu$m) within the silicon nitride films 7 and 9.

(Second Embodiment)

Figure 14:
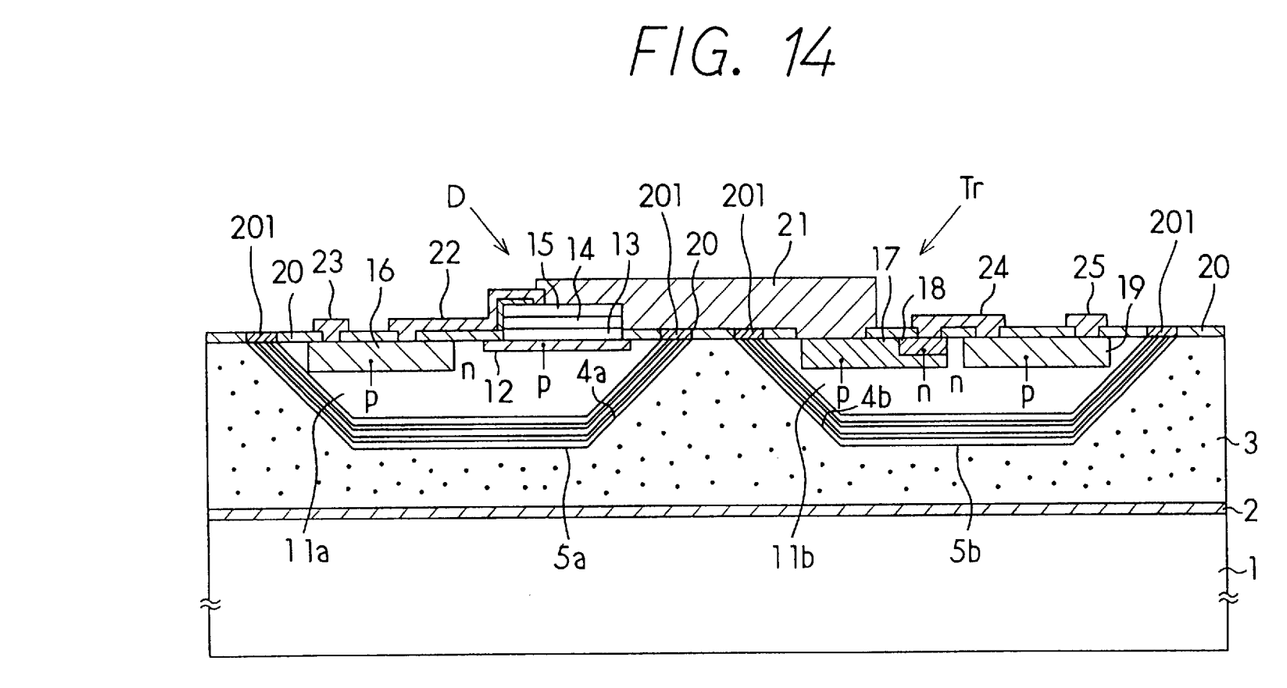
FIG. 14 is a cross-sectional view of a second embodiment of the present invention.

A second preferred embodiment of the present invention will be described hereinafter primarily in terms of differences with the first embodiment. FIG. 14 is a sectional view of a monolithic photocoupler according to the second embodiment.

According to the present embodiment, the waveguide path 21 is made up of titanium oxide or silicon nitride. Because the refractive index of titanium oxide is larger than the refractive index of silicon nitride, a confinement effect of light is large. Additionally, a silicon oxide film 201 is provided on the end portions of the isolation films 5a and 5b as a leakage-prevention layer. This silicon oxide film 201 is composed of an LTO film, and is formed by a low-pressure chemical vapor deposition method after the process indicated in FIG. 10 in the processes of the first embodiment. Any conditions for this leakage-prevention layer are acceptable provided that the leakage-prevention layer is composed of a material having a smaller refractive index than the waveguide path 21.

According to this structure, light which is propagated along the waveguide path 21 is completely reflected by the silicon oxide films 20 and 201, and so leakage of light from the waveguide path 21 to the isolation films can be prevented.

Moreover, according to the present embodiment, the leakage-preventing device is structured by the silicon oxide film 201, and so it is not necessarily required for the several film thicknesses of the silicon nitride films 7 and 9 which are the second insulation films to be established to be smaller than the wavelength of light (in the case of the present embodiment, $\lambda/n$=480 nm=0.48 $\mu$m) within the silicon nitride films 7 and 9.

Furthermore, according to the present embodiment, the silicon oxide film 201 was formed as the leakage-prevention layer in a separate process after formation (FIG. 12) of the silicon oxide film 20 by thermal oxidation, similarly to the first embodiment, but it is also acceptable to form the silicon oxide films 20 and 201 simultaneously by a low-pressured chemical vapor deposition method. Processes can thereby be shortened.

(Third Embodiment)

A cross-sectional view of a monolithic photocoupler according to a third preferred embodiment of the present invention is similar to the device shown in FIGS. 1A–1C. The third embodiment differs from the first embodiment in the fabrication process. According to the first embodiment, a case wherein film-forming temperature of the embedded polycrystalline silicon layer 3 was 600° C. was described, but according to the present embodiment, the film-forming temperature of the embedded polycrystalline silicon layer 3 is 1,000° C. or higher.

Accordingly, formation is at a film-forming temperature identical to that of the silicon oxide films and silicon nitride films as the insulation films employed as the isolation films of the several islands. More specifically, the silicon oxide films and silicon nitride films are formed at 800° C. That is to say, HTO (high-temperature oxide) films are used as the silicon oxide films. By doing this, deflection of the substrate can be suppressed even at 1,000° C. which is the film-forming temperature of the polycrystalline silicon layer 3.

According to the first embodiment, the film thickness and number of layers of the silicon oxide films and silicon nitride films are determined as conditions such that deflection of the substrate can be prevented at room temperature. At this time, the film-forming temperature of the LTO films 10, 8, and 6 was 425° C., the film-forming temperature of the silicon nitride films 9 and 7 was 800° C., and the film-forming temperature of the polycrystalline silicon layer was 600° C., and so ambient temperature during formation of the polycrystalline silicon layer 3 was in a region between the film-forming temperature of the silicon nitride films 9 and 7 and room temperature. The LTO films 10, 8, and 6 and the silicon nitride films 9 and 7 expand and contract similarly in this region and substantially no differential in stress is produced between the two.

In contrast to this, according to the third embodiment, formation of the polycrystalline silicon layer 3 after the silicon oxide films and the silicon nitride films have been formed is not in a region between the film-forming temperature of the silicon nitride films 9 and 7 and room temperature, but rather becomes 1,000° C., which is not less than the film-forming temperature of the silicon nitride films. At this time, the film-forming conditions of the silicon oxide films and the silicon nitride films of the first embodiment have been used without modification, and so there exists a susceptibility to producing internal stress such that deflection may occur between the silicon oxide films and the silicon nitride films. To avoid this, the silicon oxide films and the silicon nitride films expand and contract similarly even in a region not less than the film-forming temperature of the silicon nitride films due to the silicon oxide films and the silicon nitride films being formed at an identical film-forming temperature, and substantially no differential in stress between the two can be produced.

Further, it is preferred that the film-thickness ratio of the HTO films and the silicon nitride films be HTO:$Si_3N_4$=6 to 10:1.

In this way, according to the present embodiment, the HTO films (first films) and the silicon nitride films (second films) have been formed at an identical film-forming temperature, and so deflection of the substrate is avoided even at an ambience of 1,000° C. during formation of the polycrystalline silicon layer 3 after the HTO films and the silicon nitride films have been formed, and the polycrystalline silicon layer 3 can be deposited on a flat substrate. In this way, occurrence of deflection can be suppressed even when placed in an ambient temperature not less than the film-forming temperature of the HTO films and the silicon nitride films.

Although the present invention has been fully described in connection with the preferred embodiment thereof with reference to the accompanying drawings, it is to be noted that various changes and modifications will become apparent to those skilled in the art. For example, according to the above-described embodiment, the number of LTO films was three and the number of silicon nitride films was two, but this is not exclusive, and it is also acceptable to embody the invention by suitably varying the numbers thereof, such as by setting the number of LTO films to two and the number of silicon nitride films to one, or by setting the number of LTO films to five and the number of silicon nitride films to four, and so on.

That is to say, because the LTO films (low-pressure silicon oxide films) have $1.0 \times 10^8$ to $1.7 \times 10^8$ Pa compression internal stress and the low-pressured silicon nitride films have $0.9 \times 10^9$ to $1.6 \times 10^9$ Pa tensile internal stress, it is acceptable to implement the embodiment by a suitable combination with consideration given to reduction (canceling-out) of internal stress and to required breakdown voltage. For example, to attain an insulation breakdown voltage of 4,000 V or more, two layers of LTO film of 2.0 $\mu$m film thickness are provided, and together with this, one layer of silicon nitride film of 0.4 $\mu$m film thickness is provided [$(550 \times 2 \times 2 + 770 \times 0.4 \times 1) \times 2 = 5,016$ V breakdown voltage].

Additionally, a case using silicon oxide films and silicon nitride films created by a chemical vapor film-forming method was described, but it is also acceptable to use a silicon oxide film doped with phosphorus (phosphorus glass) in place of the silicon oxide films. It is also acceptable to use silicon oxide films and- silicon nitride films created by a plasma film-forming method. Furthermore, it is also acceptable to structure the isolation films by a multiple-layer body of $Al_2O_3$ films having compression internal stress and silicon nitride films having tensile internal stress.

Herein, according to the foregoing first embodiment, a case using identical silicon nitride for the waveguide path 21 and the second insulation films was described; although there exists a chance of light leaking from the waveguide path to the second insulation films, leakage of light thereof can be prevent by employing the structure as claimed in the present application, even in a case wherein the waveguide path 21 is structured, for example, of silicon oxide and the second insulation films are structured by silicon nitride having a refractive index greater than that of the waveguide path, or in a case wherein the waveguide path 21 is structured, for example, of silicon nitride and the second insulation films are structured by titanium oxide having a refractive index greater than that of the waveguide path.

Additionally, regarding the configuration of the trenches T1 and T2 in FIG. 6, in addition to a device wherein side surfaces thereof are tapered with respect to the substrate surface and having a bottom surface, a configuration having side surfaces perpendicular to the substrate surface is also acceptable, even when the configuration is a V-shaped concavity having no bottom surface.

Furthermore, the descriptions heretofore were regarding a monolithic photocoupler (semiconductor device), but this is not exclusive, and the invention can be applied to any and all semiconductor devices having an isolated island.

Also, when the film thickness of the second insulation films are smaller than the wavelength of light in the waveguide path, the refractive index of the second insulation films can be much larger than, larger than, or equal to the refractive index of the wave guide path.

Such changes and modifications are to be understood as being included within the scope of the present invention as defined by the appended claims.

What is claimed is:

1. A semiconductor device, comprising:
    a substrate;
    a plurality of isolation films, having an end portion thereof facing a surface of said substrate, formed within said substrate;
    a plurality of islands each made up of a region surrounded by said isolation films in said substrate;
    a light-emitting element, for emitting light, formed in one of said islands;
    a light-receiving element, for receiving light emitted by said light-emitting element, formed in an island different from said island wherein said light-emitting element is formed;
    a surface insulation film formed on a portion of said substrate other than a portion proximate said isolation-film end portion; and
    a waveguide path formed on said surface insulation film at said end portion of said isolation film on said substrate, said waveguide path being composed of a material having. a predetermined refractive index, for optically coupling said light-emitting element and said light-receiving element, wherein:
        said plurality of isolation films includes first insulation films composed of a first material having a refractive index smaller than a refractive index of said material making up said waveguide path, and second insulation films composed of a second material having a refractive index equal to or greater than a refractive index of said material making up said waveguide path and having a film thickness smaller than a wavelength of said light in said waveguide path, structured in a plurality of laminations.

2. A semiconductor device as recited in claim 1, wherein said substrate is a silicon substrate, and said surface insulation film is made up of a surface thermal oxide film wherein said silicon substrate is thermally oxidized.

3. A semiconductor device as recited in claim 1, wherein said plurality of isolation films is made up of said first insulation films and said second insulation films laminated alternatingly.

4. A semiconductor device as recited in claim 1, wherein said first material making up said first insulation films has a first thermal expansion rate and said second material making up said second insulation films has a thermal expansion rate differing from said first thermal expansion rate.

5. A semiconductor device as recited in claim 4, wherein one of said first material and said second material has compression internal stress, and the other of said first material and said second material has tensile internal stress.

6. A semiconductor device as recited in claim 1, wherein said waveguide path and said second insulation film are composed of silicon nitride, and said first insulation film is composed of silicon oxide.

7. A semiconductor device, comprising:
    a substrate;
    a plurality of isolation films, having an end portion thereof facing a surface of said substrate, formed within said substrate;
    a plurality of islands each made up of a region surrounded by said isolation films in said substrate;

a light-emitting element, for emitting light, formed in one of said islands;

a light-receiving element, for receiving light emitted by said light-emitting element, formed in an island different from said island wherein said light-emitting element is formed;

a surface insulation film formed on said substrate, on a portion of said substrate other than a portion proximate said isolation-film end portion;

a waveguide path formed on said surface insulation film at said end portion of said isolation films on said substrate, for optically coupling said light-emitting element and said light-receiving element; and means for preventing leakage of said light from said waveguide path to said isolation film disposed on said end portion;

wherein one of said isolation films is composed of a material having a refractive index equal to or greater than that of said waveguide path.

8. A semiconductor device as recited in claim 7, said leakage preventing means is disposed between said isolation-film end portion and said waveguide path and is made up of a leakage-prevention film composed of a material having a refractive index smaller than a refractive index of said waveguide path.

9. A semiconductor device, comprising:

a substrate;

a plurality of isolation films, having an end portion thereof facing a surface of said substrate, formed within said substrate;

a plurality of islands each made up of a region surrounded by said isolation films in said substrate;

a light-emitting element, for emitting light, formed in one of said islands;

a light-receiving element, for receiving light emitted by said light-emitting element, formed in an island different from said island wherein said light-emitting element is formed;

a surface insulation film formed on said substrate, on a portion of said substrate other than a portion proximate said isolation-film end portion;

a waveguide path formed on said surface insulation film at said end portion of said isolation films on said substrate, for optically coupling said light-emitting element and said light-receiving element; and means for preventing leakage of said light from said waveguide path to said isolation film disposed on said end portion;

wherein said plurality of isolation films is made up of first insulation films and said second insulation films laminated alternatingly, said first insulation films being made of a first material having a first thermal expansion rate, and said second insulation films being made of a second material having a thermal expansion rate differing from said first thermal expansion rate.

10. A semiconductor device as recited in claim 9, wherein one of said first material and said second material has compression internal stress, and the other of said first material and said second material has tensile internal stress.

11. A semiconductor device, comprising:

a substrate;

a plurality of isolation films, having an end portion thereof facing a surface of said substrate, formed within said substrate;

a plurality of islands each made up of a region surrounded by said isolation films in said substrate;

a light-emitting element, for emitting light, formed in in one of said islands;

a light-receiving element, for receiving light emitted by said light-emitting element, formed in an island different from said island wherein said light-emitting element is formed;

a surface insulation film formed on a portion of said substrate other than a portion proximate said isolation-film end portion; and a waveguide path formed on said surface insulation film at said end portion of said isolation film on said substrate, said waveguide path being composed of a material having a predetermined refractive index, for optically coupling said light-emitting element and said light-receiving element, wherein:

said plurality of isolation films includes first insulation films composed of a first material having a refractive index smaller than a refractive index of said material making up said waveguide path, and second insulation films composed of a second material having a film thickness smaller than a wavelength of said light in said waveguide path, structured in a plurality of laminations.

12. A semiconductor device, comprising:

a substrate;

a plurality of isolation films, having an end portion thereof facing a surface of said substrate, formed within said substrate;

a plurality of islands each made up of a region surrounded by said isolation films in said substrate;

a light-emitting element, for emitting light, formed in one of said islands;

a light-receiving element, for receiving light emitted by said light-emitting element, formed in an island different from said island wherein said light-emitting element is formed;

a waveguide path, formed on an end portion of said isolation films on said substrate, for optically coupling said light-emitting element and said light-receiving element; and means for preventing leakage of said light from said waveguide path to said isolation films disposed on said end portion, said plurality of isolation films including a first insulation film composed of a material having a refractive index smaller than a refractive index of said material making up said waveguide path, and a second insulation film composed of a second material having a refractive index equal to or greater than a refractive index of said material making up said waveguide path laminated with said first insulation film alternatingly.

13. A semiconductor device as recited in claim 12, wherein said leakage preventing means is disposed between said end portion and said waveguide path and is made up of a leakage-prevention film composed of a material having a refractive index smaller than a refractive index of said waveguide path.

14. A semiconductor device as recited in claim 12, wherein said waveguide path and said second insulation film are composed of silicon nitride, and said first insulation film is composed of silicon oxide.

* * * * *